(12) United States Patent
Chen et al.

(10) Patent No.: US 10,107,869 B2
(45) Date of Patent: Oct. 23, 2018

(54) DETECTION CIRCUIT

(71) Applicant: Q-SILICON TECHNOLOGIES CORP., Taipei (TW)

(72) Inventors: Jun-Yuan Chen, Taipei (TW); Chih-Te Hung, Taipei (TW); Cheng-Chung Yeh, Taipei (JP)

(73) Assignee: Q-Silicon Technologies Corp., Taipei (TW)

( * ) Notice: Subject to any disclaimer, the term of this patent is extended or adjusted under 35 U.S.C. 154(b) by 168 days.

(21) Appl. No.: 14/985,861

(22) Filed: Dec. 31, 2015

(65) Prior Publication Data
US 2017/0146612 A1 May 25, 2017

(30) Foreign Application Priority Data
Nov. 20, 2015 (TW) .............................. 104138645 A

(51) Int. Cl.
*G01R 31/40* (2014.01)
(52) U.S. Cl.
CPC ..................... *G01R 31/40* (2013.01)
(58) Field of Classification Search
CPC .......................... G01R 15/185; G01R 19/0092
USPC ........................................ 324/76, 126, 127
See application file for complete search history.

(56) References Cited

U.S. PATENT DOCUMENTS

| | | | |
|---|---|---|---|
| 5,744,990 A | 4/1998 | Burstein et al. | |
| 6,124,753 A | 9/2000 | Pease | |
| 7,312,644 B2 | 12/2007 | Messager | |
| 2006/0217906 A1* | 9/2006 | Barbara | G01R 1/36 702/60 |
| 2010/0281854 A1* | 11/2010 | Huang | F02D 41/1495 60/276 |
| 2012/0182023 A1* | 7/2012 | Zhang | G01M 11/3109 324/501 |
| 2017/0060150 A1* | 3/2017 | Stefanski | G05D 23/27 |
| 2018/0036740 A1* | 2/2018 | Nelson | B02C 19/18 |
| 2018/0059176 A1* | 3/2018 | Ding | G01R 31/2891 |

FOREIGN PATENT DOCUMENTS

| | | |
|---|---|---|
| CN | 103472283 A | 12/2013 |
| TW | 200717223 A | 5/2007 |
| TW | 201307853 A | 2/2013 |
| TW | 1407694 B | 9/2013 |

* cited by examiner

*Primary Examiner* — Giovanni Astacio-Oquendo
(74) *Attorney, Agent, or Firm* — Rosenberg, Klein & Lee

(57) ABSTRACT

The present invention provides a detection circuit, which comprises a first detection path and a second detection path for detecting the state of a power source under test. A first current is generated on the first detection path according to power source under test; a second current is generated on the second detection path according to the power source under test. The detection circuit generates a detection signal according to the first current and the second current. The detection signal represents the state of the power source under test.

12 Claims, 8 Drawing Sheets

DETECTION CIRCUIT

FIELD OF THE INVENTION

The present invention relates generally to a detection circuit, and particularly to a detection circuit used for detecting the state of a power source under test.

BACKGROUND OF THE INVENTION

Before a general electronic device starts to operate, it requires a certain waiting time for the power source to raise to a stable state. Thereby, an electronic device will make use of the waiting time for initialization such as resetting. Currently, one reset method is to use a reset circuit formed by a resistor, a capacitor, and a schmitt trigger to generate a reset signal. Nonetheless, in the method, if the power source needs a longer time to reach the normal stable state, resetting might have been ended by the reset circuit before the power source reaches the normal stable state and hence leading to operational error. In addition, if the power source of an electronic device appears rapid power down, the electronic device should be reset.

Unfortunately, when modern electronic devices are reset, the state of the power source is not detected. The state of the power source is not confirmed to reach normal and stable before the resetting ends. Besides, electronic devices do not detect occurrence of rapid power down for resetting. As a consequence, normal operations of electronic devices cannot be guaranteed.

Accordingly, the present invention provides a detection circuit for detecting the state of the power source.

SUMMARY

An objective of the present invention is to provide a detection circuit for detecting the state of a power source under test.

In order to achieve the above objective, the present invention provides a detection circuit, which comprises a first detection path and a second detection path for detecting the state of a power source under test. A first current is generated on the first detection path according to power source under test; a second current is generated on the second detection path according to the power source under test. The detection circuit generates a detection signal according to the first current and the second current. The detection signal represents the state of the power source under test.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
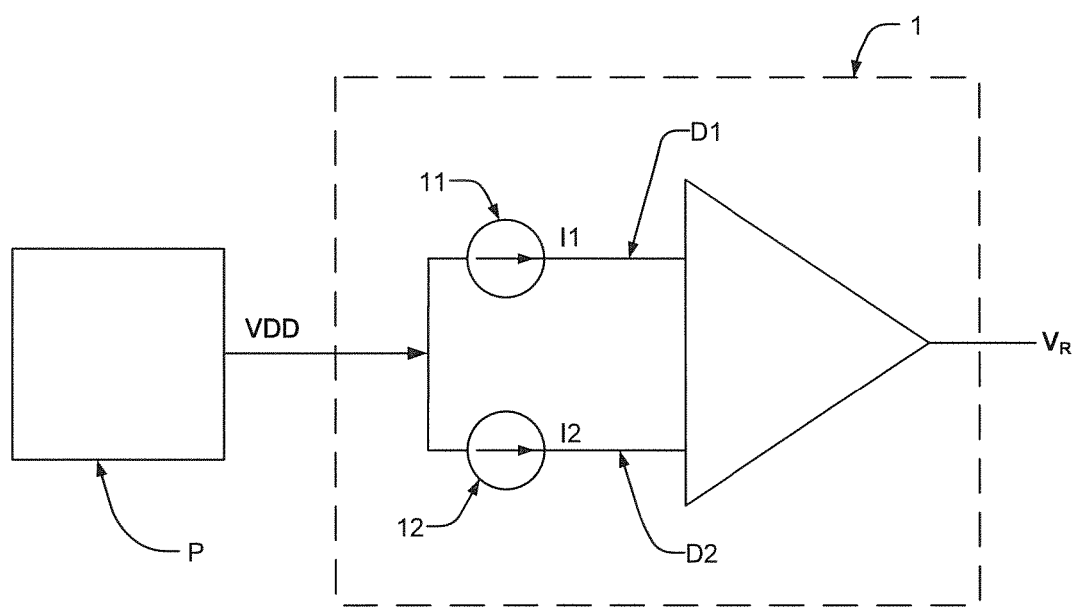
FIG. 1 shows a first schematic diagram of the detection circuit according to the present invention.

Please refer to FIG. 1, which shows a first schematic diagram of the detection circuit according to the present invention. As shown in the figure, the present invention provides a detection circuit 1, which comprises a first detection path D1 and a second detection path D2. The first detection path D1 is coupled to an output of a power source circuit P. According to the present invention, the output power source of the power source circuit P is used as an embodiment of a power source under test VDD. Nonetheless, the detection circuit 1 according to the present invention still can detect the other voltages of the circuit in the electronic device. Thereby, the detection circuit 1 according to the present invention is not limited to detecting the output power source of the power source circuit P.

Please refer again to FIG. 1. A first current I1 is generated on the first detection path D1 according to the power source under test VDD; a second current I2 is generated on the second detection path D2 according to the power source under test VDD. The operating voltage of the first detection path D1 is higher than that of the second detection path D2. In other words, during the process of raising the power source under test VDD a stable state, as the power source under test VDD is raised to the operating voltage of the second detection path D2, the second current I2. Afterwards, the first current I1 will not be generated on the first detection path D1 until the power source under test VDD is raised to the operating voltage of the first detection path D1. The detection circuit 1 generates a detection signal $V_R$, which represents the state of the power source under test VDD, according to the first and second currents I1, I2. Accordingly, the detection circuit 1 according to the present invention enables the first and second currents I1, I2 to be generated according to the different states of the power source under test VDD, and thus detecting the state of the output power source, namely, the power source under test VDD, of the power source circuit P.

Thereby, according to the variation of the first and second currents I1, I2 due to the states of the power source under test VDD, whether the power source under test VDD is in a low-voltage state or a rapid-power-down state can be judged. For example, before the first current I1 is generated, the second current I2 is generated on the second detection path D2 according to the power source under test VDD. At this moment, the power source under test in the low-voltage state. Afterwards, after the first current I1 is generated and before the second current I2 is generated, the first current I1 is reduced according to the power source under test VDD. Then the power source under test VDD is in the rapid-power-down state. In addition, the detection circuit 1 will detect the above two states and generate the detection signal $V_R$ according to the first and second currents I1, I2. Thereby, when the electronic device is just started, the detection signal $V_R$ can be used for representing if the power source under test VDD is still in the low-voltage state, which means that the output power source (the power source under test VDD) of the power source circuit P hasn't reached the stable input voltage required by the electronic device. After the electronic device operates normally, the detection signal $V_R$ can be used for representing if the output power source (the power source under test VDD) encounters rapid power down phenomenon.

The power source under test VDD is conducted to the electronic device and becomes the input voltage thereof. When the input voltage is low, the detection circuit 1 will generate the detection signal $V_R$ for controlling the electronic device to wait until the input voltage is raised to the normal operating state. For example, the detection signal $V_R$ drives the reset circuit to generate reset signals continuously and thus resetting the electronic device continuously. Nonetheless, after the electronic device operates normally, if the input voltage is lowered continuously and becomes in the rapid-power-down state, the detection circuit 1 will generate the detection signal $V_R$. According to the detection signal $V_R$, the electronic device will react, such as entering the protection state, resetting, or raising the input voltage.

Accordingly, the detection circuit 1 according to the present invention acquires the first and second currents I1, I2 according to the state of the power source under test VDD for detecting if the power source under test VDD is in the normal operating state. Thereby, it is not necessary to worry that the electronic device might stop resetting before the power source under test VDD (the input voltage) reaches the stable state. Besides, no matter the lowering slope of the power source under test VDD, the detection circuit 1 according to the present invention can successfully detect that the power source under test VDD is in the rapid-power-down state and hence further driving the reset circuit to reset the electronic device or perform the other corresponding reactions.

Figure 2:
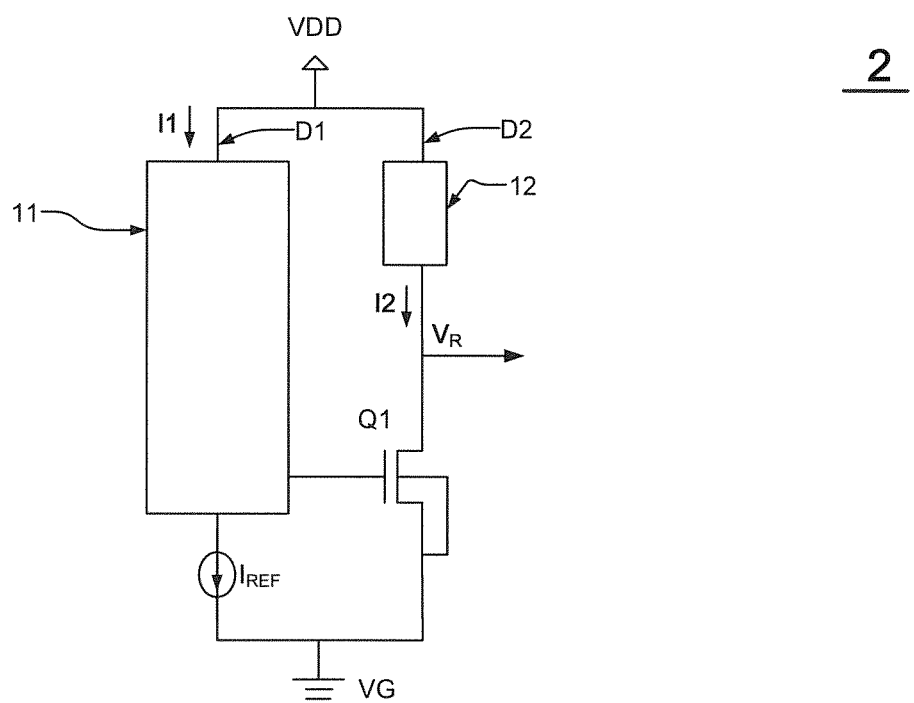
FIG. 2 shows a second schematic diagram of the detection circuit according to the present invention.

Please refer to FIG. 2, which shows a second schematic diagram of the detection circuit according to the present invention. As shown in the figure, the detection circuit 2 comprises a first current generating circuit 11, a second current generating circuit 12, and a transistor Q1. The first current generating circuit 11 is coupled to the power source under test VDD and generates the first current I1 on the first detection path D1 according the power source under test VDD. The second current generating circuit 12 is coupled to the power source under test VDD and generates the second current I2 on the second detection path D2 according the power source under test VDD. An output of the detection circuit 2 is coupled to the power source under test VDD via the second current generating circuit 12. The detection signal $V_R$ is generated at the output. The transistor Q1 is coupled between the output of the detection circuit 2 and a ground VG. The first current I1 controls conduction of the transistor Q1 and determines the level of the detection signal $V_R$.

Figure 3:
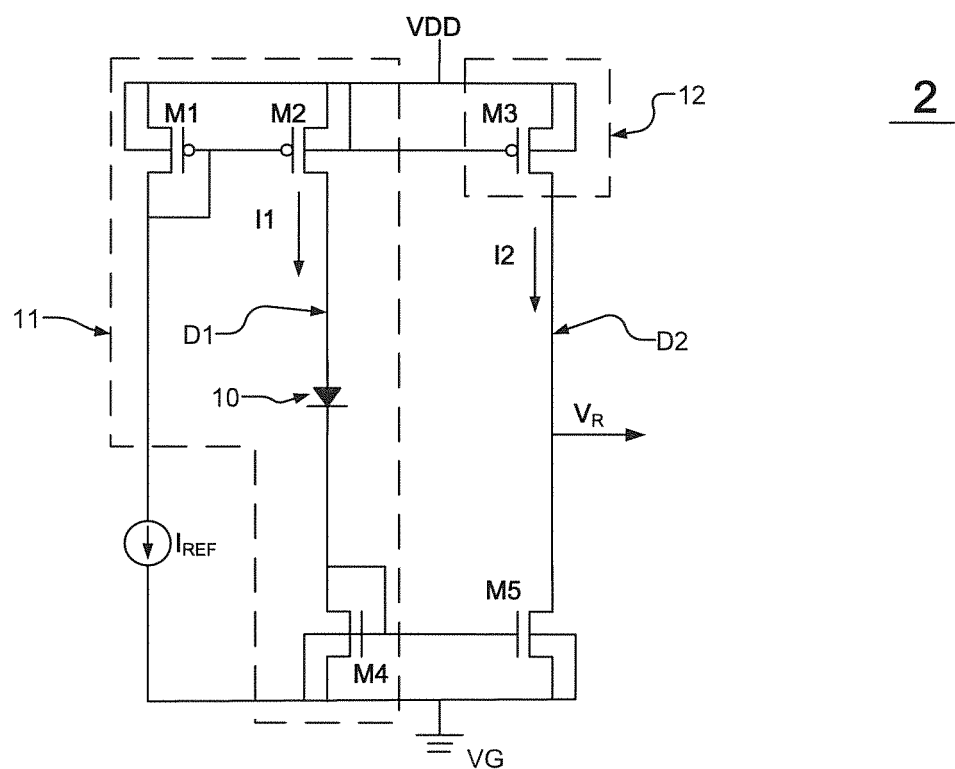
FIG. 3 shows a circuit diagram of the detection circuit according to the first embodiment of the present invention.

Please refer to FIG. 3, which shows a circuit diagram of the detection circuit according to the first embodiment of the present invention. As shown in the figure, FIG. 3 is the detailed circuit diagram of FIG. 2. The first current generating circuit 11 includes a first current mirror; the second current generating circuit 12 includes a second current mirror. Furthermore, a boost circuit 10 disposed on the first detection path D1 of the detection circuit 2. The boost circuit 10 can include a diode or a plurality of diodes. The first detection path D1 is operated at a first operating voltage. Thereby, the boost circuit 10 on the first detection path D1 will raise the first operating voltage of the first detection path D1. In other words, the first detection path D1 will be operated at the first operating voltage according to the boost circuit 10. Likewise, the second detection circuit D2 will be operated at a second operating voltage. Nonetheless, because the second detection path D2 does not include the boost circuit 10, the boost circuit 10 will drive the first operating voltage to be higher than the second operating voltage.

According to the detection circuit 2 of the present invention, when the level of the power source under test VDD is higher than the level of the second operating voltage but not reaching the level of the first operating voltage, the detection circuit 2 will generate the second current I2 but not the first current I1, meaning that the power source under test VDD is in the low voltage. Contrarily, as the level of the power source under test VDD is higher than the level of the first operating voltage, it means that the power source under test VDD is not in the low voltage and the detection circuit 2 will generate the first current I1. In other words, the boost circuit 10 enables the first operating voltage to be higher than the second operating voltage, so that the first and second currents I1, I2 represent the power source under test VDD in distinct states. The number of diodes included in the boost circuit 10 can be designed according to the requirement. The present invention does not limit the design scope of the boost circuit 100. For example, if the number of the diode 10 on the first detection path D1 is greater, the first operating voltage will be higher. Then the first current I1 will not be generated unless the power source under test VDD is raised to a higher level. Thereby, if the first current I1 is not generated, the detection signal $V_R$ generated by the detection circuit 21 is in the low-voltage or rapid-power-down state.

Please refer again to FIG. 3. The detection circuit 2 comprises a reference current source $I_{REF}$, the first current mirror, the second current mirror, and a third current mirror. The first current mirror includes a first transistor M1 and a second transistor M2. The second current mirror includes the first transistor M1 and a third transistor M3. The third current mirror includes a fourth transistor M4 and a fifth transistor M5. The first, second, and third transistors M1, M2, M3 are p-type transistors; the fourth and fifth transistors M4, M5 are n-type transistors. That is to say, the first and second current mirrors include a plurality of p-type transistors whereas the third current mirror includes a plurality of n-type transistors.

The first transistor M1 is coupled between the power source under test VDD and the reference current source $I_{REF}$; the second transistor M2 is coupled to the first transistor M1, the reference current source $I_{REF}$, the power source under test VDD, and the boost circuit 10. The second transistor M2 generates the first current I1 on the first detection path D1 according to the power source under test VDD and the reference current source $I_{REF}$. The boost circuit 10 will boost the second transistor M2 and generate the operating voltage of the first current I1. The third transistor M3 is coupled to the first transistor M1, the reference current source $I_{REF}$, the power source under test VDD, and the output of the detection circuit 2 for generating the second current I2 on the second detection path D2 and the output of the detection circuit 2 according to the power source under test VDD and the reference current source $I_{REF}$. In addition, the fourth transistor M4 is equivalent to a control device and controls the fifth transistor M5, which is equivalent to the transistor Q1 in FIG. 2. Thereby, the control device M4 is coupled to the boost circuit 10 and the fifth transistor M5. The fifth transistor M5 is coupled between the output and the ground VG. The control device M4 controls the conduction of the fifth transistor M5 according to the first current I1, and thus driving the level of the detection signal $V_R$ of the detection circuit 2 to low.

The reference current source $I_{REF}$ is coupled between the first transistor M1 and the ground VG, and, together with the power source under test VDD, controls the first and second current mirrors to generate the first and second currents I1, I2. The first current mirror is coupled to the reference current source $I_{REF}$ and the power source under test VDD, and generates the first current I1 on the first detection path D1 according to the reference current source $I_{REF}$ and the power source under test VDD. The second current mirror is coupled to the reference current source $I_{REF}$ and the power source under test VDD, and generates the second current I2 on the second detection path D2 according to the reference current source $I_{REF}$ and the power source under test VDD. The third current mirror is coupled to the boost circuit 10 and the output. Thereby, the first current I1 controls the third current mirror and enables the second current I2 to flow through the third current mirror to the ground VG, hence reducing the level of the detection signal $V_R$.

In other words, when the power source under test VDD is operating normally, the first current I1 enables the discharging capability (pulling down capability) of the fifth transistor M5 to be higher than the charging capability (pull up capability) of the second transistor M2. Thereby, the detection signal $V_R$ is low at this time, meaning that the power source under test VDD is in the normal state. As the power source under test VDD is in the low-voltage or rapid-power-down state, the first current I1 is not generated, making the fifth transistor M2 off. Thereby, the discharging capability of the fifth transistor M5 is lower than the charging capability of the second transistor M2. At this time, the detection signal $V_R$ is high, which means that the power source under test VDD is not operating normally.

Figure 4:
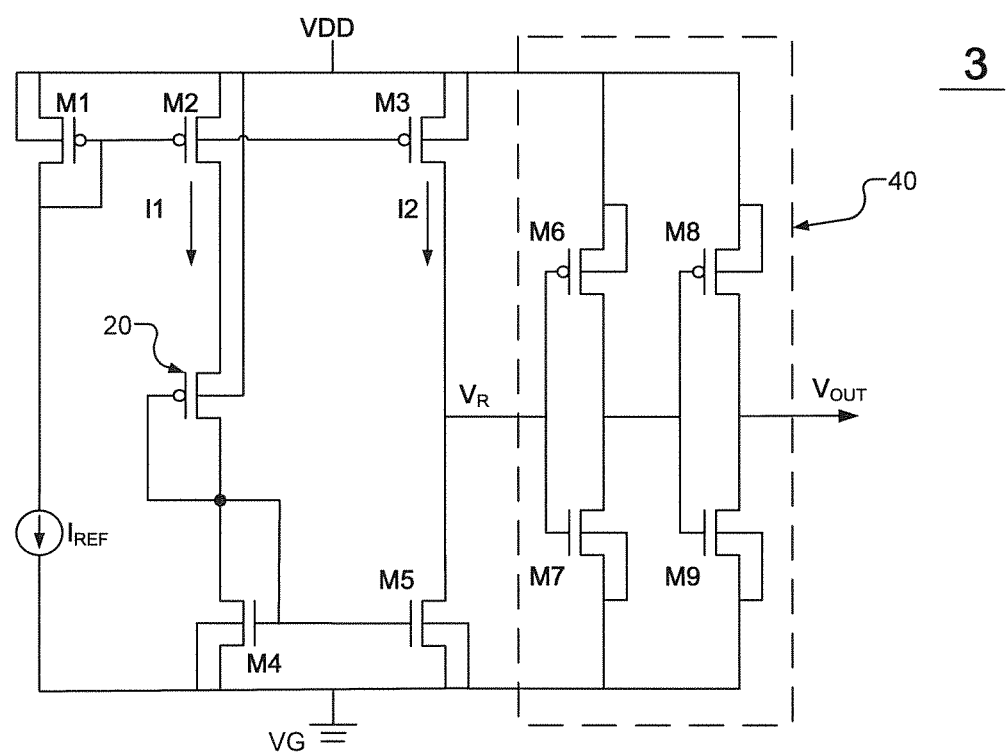
FIG. 4 shows a circuit diagram of the detection circuit according to the second embodiment of the present invention.

Please refer to FIG. 4, which shows a circuit diagram of the detection circuit according to the second embodiment of the present invention. As shown in the figure, the detection circuit 3 according to the present invention includes a waveform adjuster 40, which receives the detection signal $V_R$ and adjusts the waveform thereof to a square wave as the output $V_{OUT}$ for resetting. Namely, the output $V_{OUT}$ is provided to the reset circuit for resetting. The waveform adjuster 40 comprises a sixth transistor M6, a seventh transistor M7, an eighth transistor M8, and a ninth transistor M9. The detection signal $V_R$ generated by the detection circuit 3 can be also used for driving the electronic device into the protection state or as the reference for boosting the input voltage. Accordingly, the result of detecting if the power source operates normally by the detection circuit according to the present invention can be used as the reference for various controls by rear-stage circuits such as the low-voltage protection circuit or the reset circuit.

Besides, the boost circuit 20 according to the second embodiment is different from the boost circuit 10 according to the first embodiment. The boost circuit 20 according to the second embodiment is replaced by a p-type transistor. The gate of the p-type transistor is coupled to the drain thereof. Then the drain of the p-type transistor is coupled to the drain of the fourth transistor M4. The drain of the fourth transistor M4 is coupled to the gates of the fourth and fifth transistors M4, M5. In addition, the number of the p-type transistor can be determined freely. Accordingly, the boost circuit 20 according to the present invention can be one or more diode or one or more p-type transistor.

Figure 5:
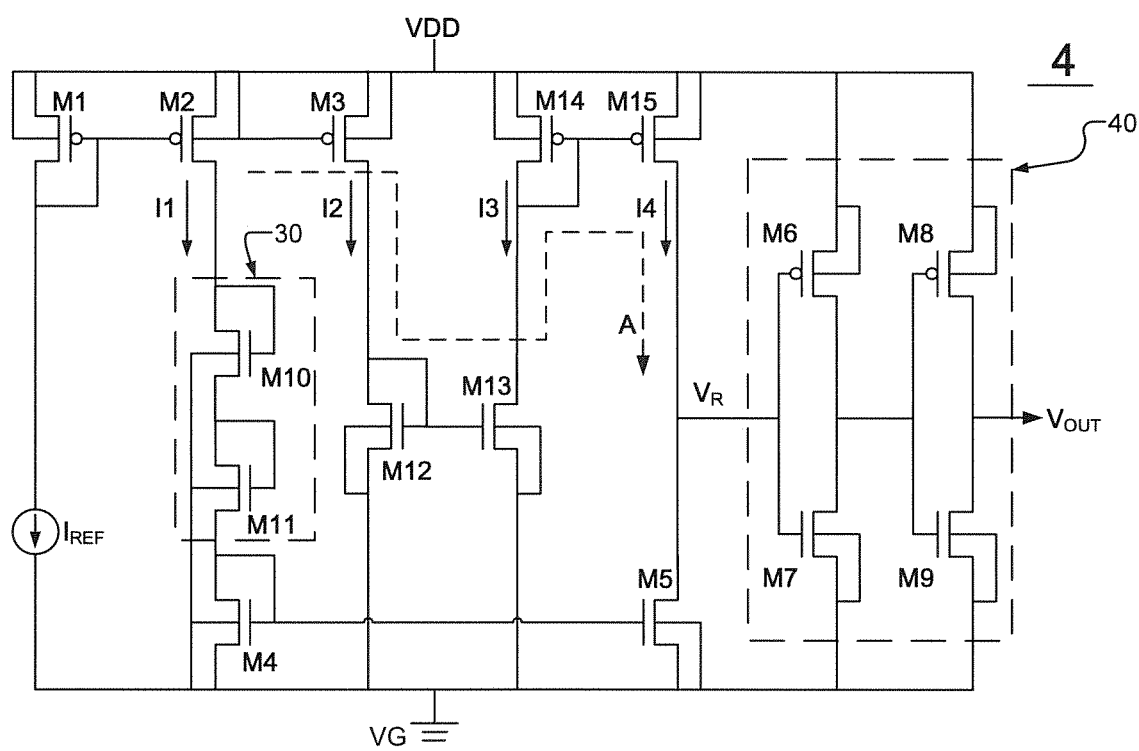
FIG. 5 shows a circuit diagram of the detection circuit according to the third embodiment of the present invention.

Please refer to FIG. 5, which shows a circuit diagram of the detection circuit according to the third embodiment of the present invention. As shown in the figure, the boost circuit 30 in the detection circuit 4 according to the present invention is different from the boost circuit 20 according to the second embodiment. The boost circuit 30 according to the third embodiment is replaced by a plurality of n-type transistors M10, M11. The function of the plurality of n-type transistors M10, M11 is the same as diode. Alternatively, the boost circuit 30 can adopt resistors as well. Namely, the boost circuit 30 can include one or more resistor or one or more n-type transistor.

Moreover, the detection circuit 4 according to the third embodiment further comprises a protection circuit, which includes a twelfth transistor M12, a thirteenth transistor M13, a fourteenth transistor M14, and a fifteenth transistor M15. The twelfth and thirteenth transistors M12, M13 form a current mirror coupled to the third transistor M3 for mirroring the second current I2 and generating a third current I3. The fourteenth and fifteenth transistors M14, M15 form a current mirror coupled to the thirteenth transistor M13 for mirroring the third current I3 and generating a fourth current I4. Besides, the protection circuit is coupled between the second current mirror and the output of the detection circuit 4 and provides a protection path A for the detection circuit 4 for preventing the influence of static charges on the second current I2 and, in turn, on the output of the detection circuit 4. According to an embodiment of the present invention, the levels of the currents I3, I4 are equal to the level of the second current I2.

Please refer again to FIG. 5. The added transistors M12~M15 in the third embodiment can add paths for the second current I2 to the waveform adjuster 40. Thereby, as the air discharge occurs, the added paths by the transistors M12~M15 can prevent the second current I2 from pull up the level of the detection signal $V_R$ abruptly. Consequently, given few abnormality in the detection signal $V_R$, few abnormal signal (the output $V_{OUT}$) will be generated in the detection circuit 4.

Figure 6:
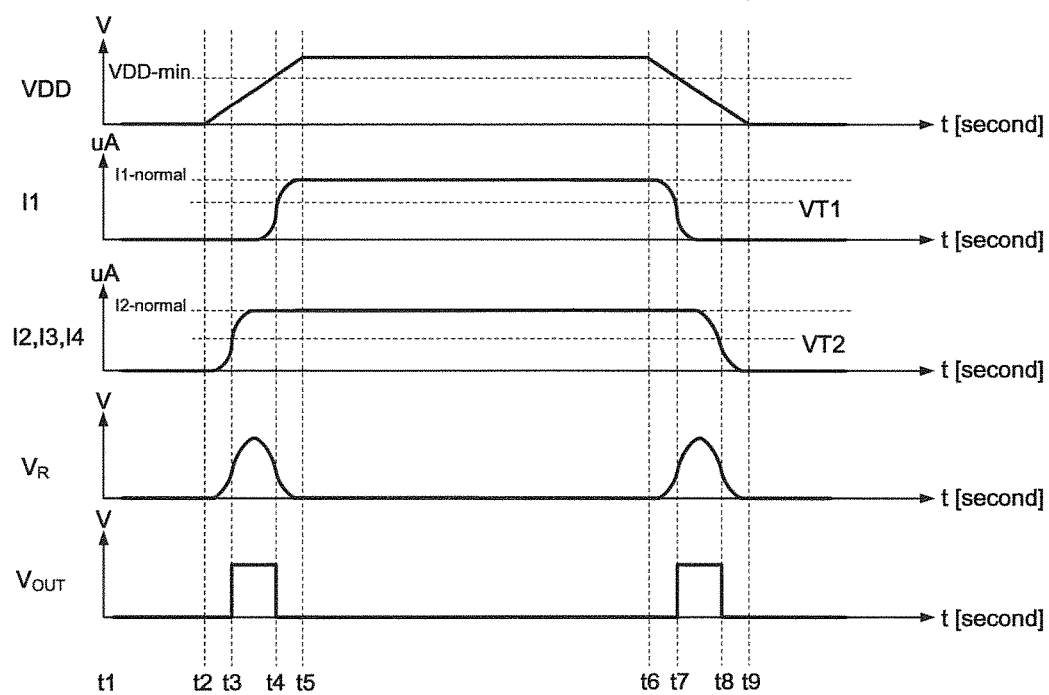
FIG. 6 shows signal waveforms of the detection circuit according to the present invention.

Please refer to FIG. 5 and FIG. 6 together. FIG. 6 shows signal waveforms of the detection circuit according to the present invention. As shown in the figure, in the time between t1 and t3, the power source under test VDD starts to rise; the second current mirror generates the second current I2; the protection circuit will generates the third and fourth currents I3, I4 according to the second current I2. Because the level of the power source under test VDD has not reaches the operating voltage for the first current mirror to generate the first current I1, the first current mirror has not generated the first current I1 yet. Thereby, the fourth current I4 is raised to the level of the detection signal $V_R$. In addition, the levels of the currents I2~I4 will rise as the power source under test VDD continues to rise. Thereby, as the levels of the currents I2~I4 is raised to a second threshold VT2, the detection signal $V_R$ will become to high level. It means that the power source under test VDD is currently in the low-voltage state for driving the electronic device to perform subsequent processes, such as driving the reset circuit to generate a reset signal for resetting or controlling the protection circuit to execute circuit protection. Besides, the levels of the current I2~I4 will continue to rise until a normal level I2−normal.

In the time between t3 and t4, the power source under test VDD continues to rise. The first current I1 starts to be generated. The first current I1 will drive the third current to flow and thus turning one the fifth transistor M5. Thereby, the level of the detection signal $V_R$ will be lowered gradually. Furthermore, when the power source under test VDD increases to a threshold VDD−min and the first current I1 also increases to a first threshold VT1, the level of the detection signal $V_R$ will become low due to continuous discharging. Thereby, the reset circuit will be driven to stop generating the reset signal and nor resetting will go on. Afterwards, the level of the first current I1 will continue to increase until a normal level I1–normal. In addition, the waveform adjuster 40 will adjust the level of the detection signal $V_R$ to a square wave, which is just the output $V_{OUT}$ of the detection circuit. Please refer again to Figure. The actions of the detection circuit in the time t6~t9 is similar to those in the time t1~t5. The difference is that the level of the detection signal $V_R$ in the time t3~t4 means that the power source under test VDD is in the low-voltage state whereas the level of the detection signal $V_R$ in the time t7~t8 means that the power source under test VDD is in the rapid-power-down state. Thereby, the actions of the detection circuit in the time t6~t9 will not be described again.

Figure 7:
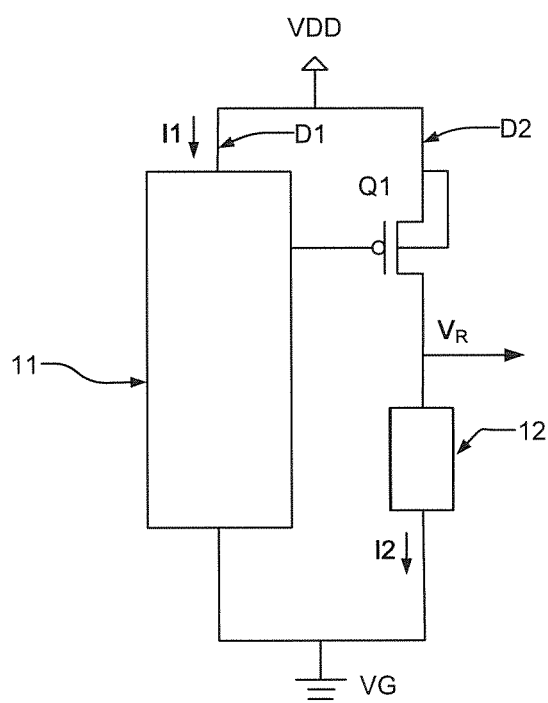
FIG. 7 shows a third schematic diagram of the detection circuit according to the present invention.

Please refer to FIG. 7, which shows a third schematic diagram of the detection circuit according to the present invention. As shown in the figure, the difference between FIG. 7 and FIG. 2 is the locations for disposing the transistor Q1 and the second current generating circuit 12. Besides, the transistor Q1 in FIG. 2 is an n-type transistor whereas the transistor Q1 in FIG. 7 is a p-type transistor. The first current generating circuit 11 generates the first current I1 on the first detection path D1 according to the power source under test VDD; the second current generating circuit 12 generates the second current I2 on the second detection path D2 according to the power source under test VDD. The output of the detection circuit 5 is coupled to the ground VG via the second current generating circuit 12. The detection signal $V_R$ is generate at the output. The transistor Q1 is coupled between the output of the detection circuit 5 and the power source under test VDD. The first current I1 controls the conduction of the transistor Q1 and determines the level of the detection signal $V_R$.

Furthermore, the change in the level of the detection signal $V_R$ according to the embodiment of FIG. 7 is exactly the inverse of the change in the level of the detection signal $V_R$ in FIG. 2. When the level of the power source under test VDD is lower than the threshold VDD–min and the second current generating circuit 12 generates the second current I2, the level of the detection signal $V_R$ in FIG. 2 is high. Nonetheless, the level of the detection signal $V_R$ in FIG. 7 is low. This is because the second current generating circuit 12 operates while the first current generating circuit 11 has not operated normally for turning on the transistor Q1 completely. Besides, when the level of the power source under test VDD is equal to or higher than the threshold VDD–min and the first current generating circuit 11 generates the first current I1 and turning on the transistor Q1, the level of the detection signal $V_R$ in FIG. 2 is low, whereas the level of the detection signal $V_R$ in FIG. 7 is high. This is because the first current I1 turns on the transistor Q1 and raises the level of the detection signal $V_R$ to high.

Figure 8:
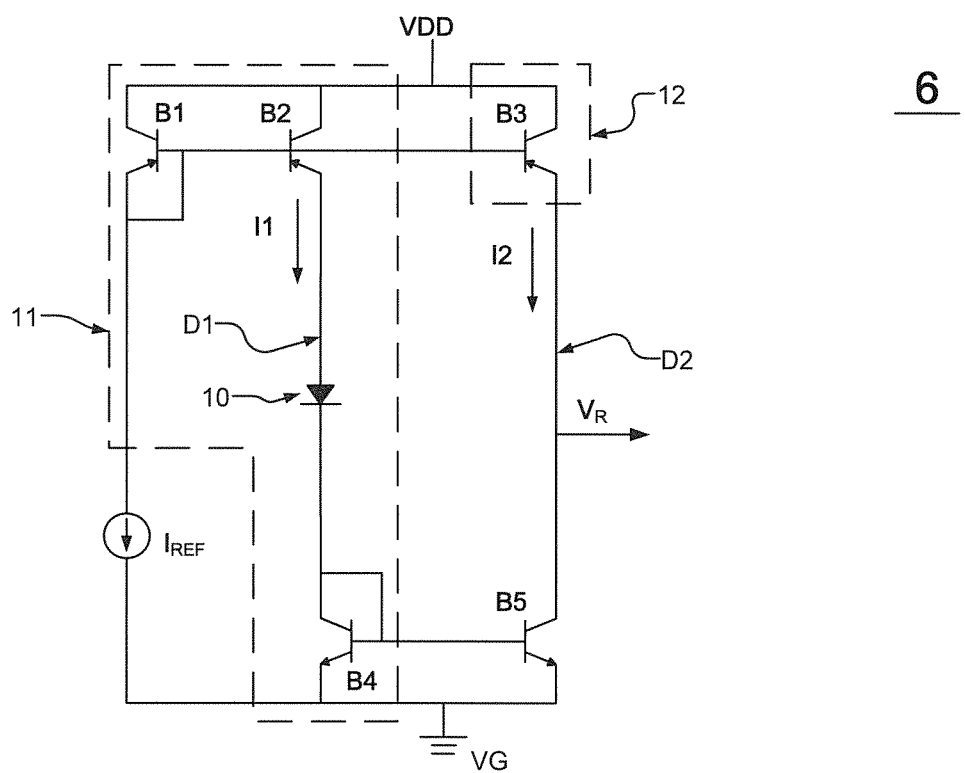
FIG. 8 shows a circuit diagram of the detection circuit according to the fourth embodiment of the present invention.

In addition to using meal-oxide-semiconductor field-effect transistors (MOSFET) to design circuit, bipolar junction transistors (BJT) can be used to replace MOSFETs. Please refer to FIG. 8, which shows a circuit diagram of the detection circuit according to the fourth embodiment of the present invention. As shown in the figure, the difference between FIG. 8 and FIG. 3 is that the circuit in FIG. 3 is designed using MOSFETs while the circuit in FIG. 8 is done by BJTs. Likewise, the circuits in FIGS. 4 and 5 can use BJTs to replace MOSFETs. The detection circuit 6 in FIG. 8 includes a reference current source $I_{REF}$ and a plurality of current mirrors. The current mirrors are designed using BJTs. The first BJT B1 to the third BJT B3 are PNP transistors, whereas the fourth BJT B4 to the fourth BJT B5 are NPN transistors. In other words, PNP transistors can replace p-type transistors (PMOS) while NPN transistors can replace n-type transistors (NMOS).

The first BJT B1 is coupled between the power source under test VDD and the reference current source $I_{REF}$; the second BJT B2 is coupled to the first BJT B1, the reference current source $I_{REF}$, the power source under test VDD, and the boost circuit 10. The second BJT B2 generates the first current I1 on the first detection path D1 according to the power source under test VDD and the reference current source $I_{REF}$. The boost circuit 10 will boost the second BJT B2 and generate the operating voltage of the first current I1. The third BJT B3 is coupled to the first BJT B1, the reference current source $I_{REF}$, the power source under test VDD, and the output of the detection circuit 6 for generating the second current I2 on the second detection path D2 and the output of the detection circuit 6 according to the power source under test VDD and the reference current source $I_{REF}$. In addition, the fourth BJT B4 is equivalent to a control device and controls the fifth BJT B5.

The control device M4 is coupled to the boost circuit 10 and the fifth BJT B5. The fifth BJT B5 is coupled between the output and the ground VG. The control device M4 controls the conduction of the fifth BJT B5 according to the first current I1, and thus driving the level of the detection signal $V_R$ of the detection circuit 6 to low. Likewise, the boost circuit 10 according to the present embodiment can be designed using BJTs. Using the diode 10 to act as the boost circuit 10 in FIG. 8 is only an embodiment of the present invention.

To sum up, the present invention provides a detection circuit, which comprises a first detection path and a second detection path for detecting the state of a power source under test. A first current is generated on the first detection path according to power source under test; a second current is generated on the second detection path according to the power source under test. The detection circuit generates a detection signal according to the first current and the second current. The detection signal represents the state of the power source under test.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A detection circuit, detecting a state of a power source under test, and comprising:
   a first detection path, in which a first current is generated on said first detection path according to said power source under test; and a second detection path, in which a second is current generated on said second detection path according to said power source under test;
   where said detection circuit generates a detection signal according said first current and said second current, said detection signal represents the state of said power source under test.

2. The detection circuit of claim 1, wherein before said first current is generated, said second current is generated according to said power source under test; said detection signal represents that said power source under test is in a low-voltage state.

3. The detection circuit of claim 1, wherein before second current is decreased, said first current is decreased according to said power source under test; said detection signal represents that said power source under test is in a rapid-power-down state.

4. The detection circuit of claim 1, wherein a boost circuit is disposed on said first detection path; said first detection path is operating at a first operating voltage; said second detection path is operating at a second operating voltage; said boost circuit raises said first operating voltage of said first detection path; said boost circuit drives the first operating voltage to be higher than said second operating voltage; when the level of said power source under test is higher than the level of said second operating voltage, said detection circuit generates said second current; when the level of said power source under test is higher than the level of said first operating voltage, said detection circuit generates said first current; said first current and said second current represent the different states of said power source under test; when said first current is not generated, said detection signal represents that said power source under test is in a low-voltage state or a rapid-power-down state.

5. The detection circuit of claim 4, wherein said boost circuit includes one or more resistor, one or more diode, one or more n-type transistor, one or more p-type transistor, or one or more bipolar junction transistor.

6. The detection circuit of claim 1, and further comprising:
    a first current generating circuit, coupled to said power source under test, generating said first current on said first detection path according to said power source under test;
    a second current generating circuit, coupled to said power source under test, generating said second current on said second detection path according to said power source under test, an output of said detection circuit coupled to said power source under test through said second current generating circuit, said detection signal generated at said output; and
    a transistor, coupled between said output of said detection circuit and a ground, said first current controlling the conduction of said transistor and determining the level of said detection signal.

7. The detection circuit of claim 6, wherein said first current generating circuit includes a first current mirror coupled to a reference current source and said power source under, and generating said first current according to said reference current source and said power source under test, and said second current generating circuit includes a second current mirror coupled to said reference current source and said power source under, and generating said second current according to said reference current source and said power source under test.

8. The detection circuit of claim 7, and further comprising a control device, coupled to a boost circuit and said transistor, and controlling the conduction of said transistor according to said first current;
    said first current mirror including:
        a first transistor, coupled between said power source under test and said reference current source;
        a second transistor, coupled to said first transistor, said reference current source, said power source under test, and a boost circuit, and generating said first current according to said power source under test and said reference current source, said boost circuit raising the operating voltage of generating said first current generated by said second transistor; and
    said second current mirror including:
        a third transistor, coupled to said first transistor, said reference current source, said power source under test, and said output of said detection circuit, and generating said second current at said output of said detection circuit according to said power source under test and said reference current source;
    where said control device control the conduction of said transistor according to said first current and drives the level of said detection signal of said detection circuit to a low level.

9. The detection circuit of claim 8, wherein said first transistor, said second transistor, and said third transistor are p-type transistors or PNP transistors, and said control device and said transistor are n-type transistors or NPN transistors.

10. The detection circuit of claim 7, and further comprising a protection circuit coupled between said second current mirror and said output of said detection circuit for providing a protection path to said detection circuit.

11. The detection circuit of claim 6, and further comprising a waveform adjuster, receiving said detection signal, and adjusting the waveform of said detection signal for a resetting work.

12. The detection circuit of claim 1, and further comprising:
    a first current generating circuit, generating said first current on said first detection path according to said power source under test;
    a second current generating circuit, generating said second current on said second detection path according to said power source under test, an output of said detection circuit coupled to a ground through said second current generating circuit, and said detection signal generated at said output; and
    a transistor, coupled between said output of said detection circuit and said power source under test, and said first current controlling the conduction of said transistor to determine the level of said detection signal.

* * * * *